United States Patent
Do et al.

(10) Patent No.: US 7,948,066 B2
(45) Date of Patent: May 24, 2011

(54) INTEGRATED CIRCUIT PACKAGE SYSTEM WITH LEAD LOCKING STRUCTURE

(75) Inventors: Byung Tai Do, Singapore (SG); Heap Hoe Kuan, Singapore (SG); Linda Pei Ee Chua, Singapore (SG)

(73) Assignee: Stats Chippac Ltd., Singapore (SG)

( * ) Notice: Subject to any disclaimer, the term of this patent is extended or adjusted under 35 U.S.C. 154(b) by 669 days.

(21) Appl. No.: 11/964,501

(22) Filed: Dec. 26, 2007

(65) Prior Publication Data

US 2009/0166823 A1 Jul. 2, 2009

(51) Int. Cl.
*H01L 23/495* (2006.01)
*H01L 21/44* (2006.01)

(52) U.S. Cl. . 257/666; 257/784; 257/787; 257/E23.051; 438/112; 438/124

(58) Field of Classification Search ............ 257/666, 257/E23.051, 787, 784, 4; 438/112, 124
See application file for complete search history.

(56) References Cited

U.S. PATENT DOCUMENTS

| | | | |
|---|---|---|---|
| 5,859,471 A * | 1/1999 | Kuraishi et al. | 257/666 |
| 6,001,671 A | 12/1999 | Fjelstad | |
| 6,072,239 A | 6/2000 | Yoneda et al. | |
| 6,242,281 B1 * | 6/2001 | Mclellan et al. | 438/106 |
| 6,309,909 B1 * | 10/2001 | Ohgiyama | 438/112 |
| 6,329,711 B1 | 12/2001 | Kawahara et al. | |
| 6,333,252 B1 | 12/2001 | Jung et al. | |
| 6,358,778 B1 * | 3/2002 | Shinohara | 438/123 |
| 6,427,976 B1 * | 8/2002 | Huang et al. | 257/676 |
| 6,498,099 B1 * | 12/2002 | McLellan et al. | 438/689 |
| 6,528,893 B2 | 3/2003 | Jung et al. | |
| 6,713,322 B2 * | 3/2004 | Lee | 438/123 |
| 6,927,483 B1 * | 8/2005 | Lee et al. | 257/676 |
| 6,969,905 B2 | 11/2005 | Paulus | |
| 7,064,001 B2 | 6/2006 | Kazama et al. | |
| 7,087,462 B1 * | 8/2006 | Park et al. | 438/112 |
| 2003/0164554 A1 * | 9/2003 | Fee et al. | 257/787 |
| 2005/0003586 A1 * | 1/2005 | Shimanuki et al. | 438/124 |
| 2006/0060981 A1 | 3/2006 | Paulus | |
| 2007/0090495 A1 | 4/2007 | Kim et al. | |

\* cited by examiner

*Primary Examiner* — Nitin Parekh
(74) *Attorney, Agent, or Firm* — Mikio Ishimaru

(57) ABSTRACT

A mountable integrated circuit package system includes: providing a base; depositing a photoresist on the base; patterning the photoresist with an opening; filling the opening with a metal; depositing a further metal on the metal to form a lead pad; removing the photoresist; attaching a die over the base; bonding wires between the die and the lead pad; encapsulating the die and the lead pad in an encapsulation formed into a lead pad lock adjacent the lead pad; and removing the base.

20 Claims, 8 Drawing Sheets

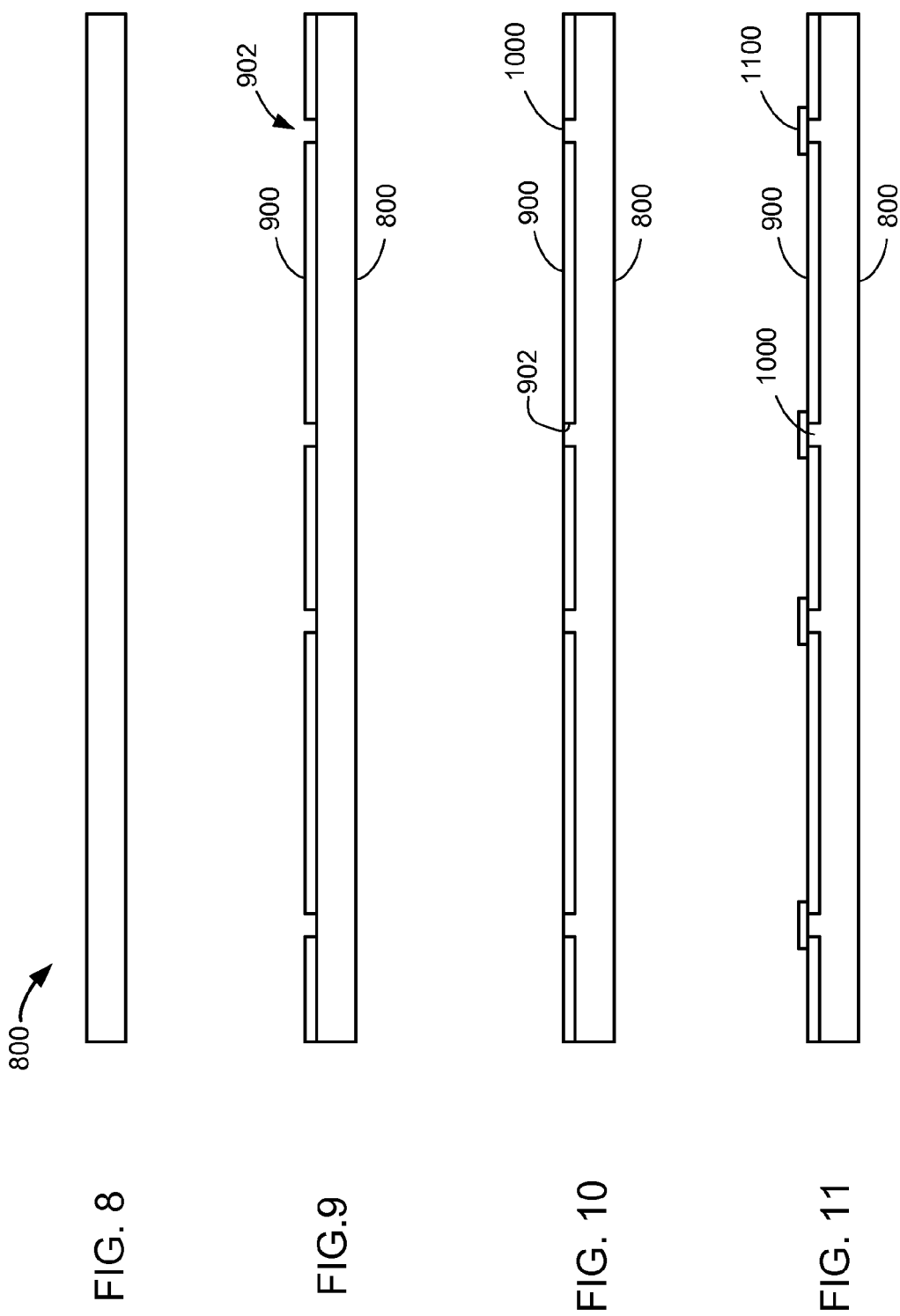

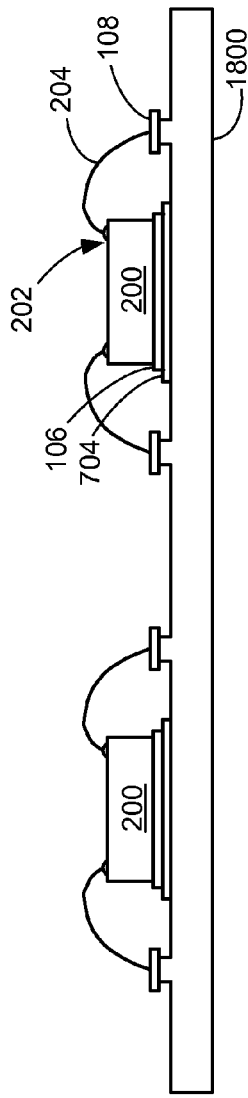
FIG. 24
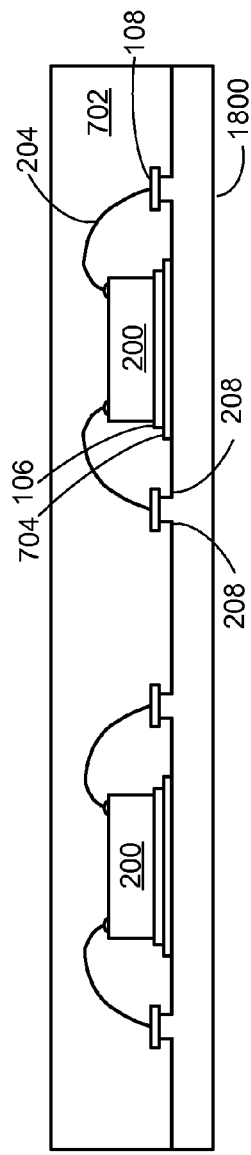
FIG. 25
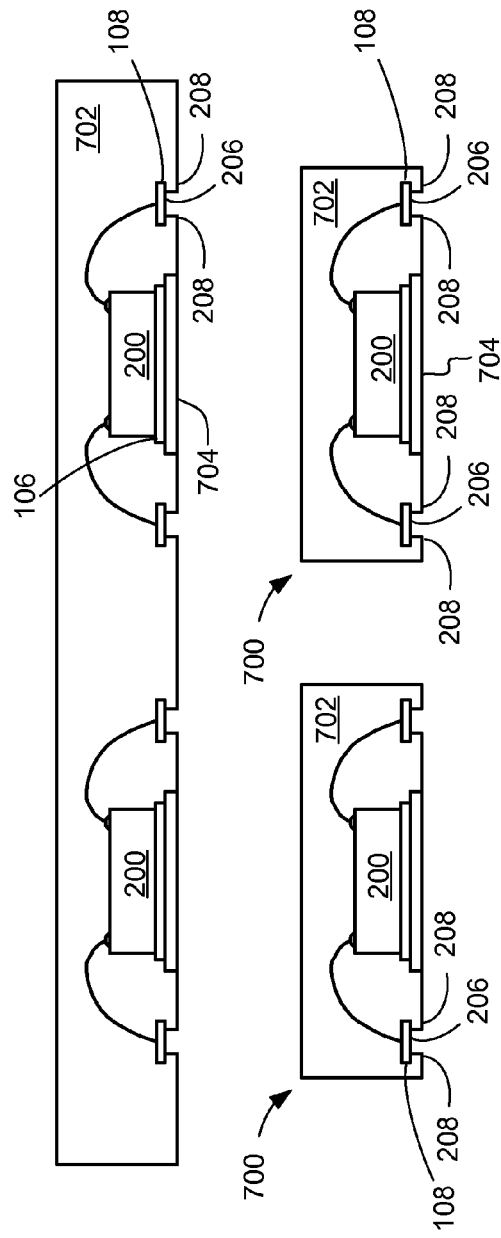
FIG. 26
FIG. 27

INTEGRATED CIRCUIT PACKAGE SYSTEM WITH LEAD LOCKING STRUCTURE

TECHNICAL FIELD

The present invention relates generally to an integrated circuit package system and more particularly to an encapsulated integrated circuit package system.

BACKGROUND ART

The need for portable personal electronics, such as cell phones, digital cameras, music players, personal digital assistants (PDA's), and location-based devices, is driving the necessity for increased integrated circuit ("IC") density. To interface an IC with other circuitry, it is common to mount it on a leadframe or substrate. Each IC has bonding pads that are individually connected to the substrate's contact or terminal pads using extremely fine gold or aluminum wires or conductive balls, such as solder balls. The assemblies are then packaged by individually encapsulating them in molded plastic or ceramic bodies to create an IC package.

IC packaging technology has seen an increase in the number of ICs mounted on a single circuit board or substrate. The new packaging designs have more compact form factors, such as the physical size and shape of a packaged IC, and provide a significant increase in overall IC density.

However, IC density continues to be limited by the "real estate" available for mounting individual ICs on a substrate. Even larger form factor systems, such as personal computers (PC's), computer servers, and storage servers, need to accommodate more ICs in the same or smaller "real estate".

This increased IC density has led to the development of multi-chip packages in which more than one IC can be packaged. Each package provides mechanical support for the individual ICs and one or more layers of interconnect lines that enable the ICs to be connected electrically to surrounding circuitry.

Current multi-chip packages, also commonly referred to as multi-chip modules, typically consist of a printed circuit board (PCB) substrate onto which a set of separate IC components are directly attached. Such multi-chip packages have been found to increase IC density and miniaturization, improve signal propagation speed, reduce overall IC size and weight, improve performance, and lower costs, all of which are primary goals of the computer and electronics industry.

Multi-chip packages whether vertically or horizontally arranged, can also present problems because they usually must be pre-assembled before the IC and IC connections can be tested. Thus, when ICs are mounted and connected in a multi-chip module, individual ICs and connections cannot be tested individually, and it is not possible to identify known-good-die ("KGD") before the multi-chip is assembled. Consequently, conventional multi-chip packages lead to assembly process yield problems. This fabrication process, which does not identify KGD, is therefore less reliable and more prone to assembly defects.

Moreover, vertically stacked ICs in typical multi-chip packages can present problems beyond those of horizontally arranged IC packages, further complicating the manufacturing process. It is more difficult to test and thus determine the actual failure mode of the individual ICs. Moreover, the substrate IC are often damaged during assembly or testing, complicating the manufacturing process and increasing costs.

For both vertical and horizontal multi-chip packages, assembly of the multi-chip packages must have reliable electrical and mechanical attachments between the multiple ICs, the stacked packaged ICs, or a combination thereof. For example, the encapsulating process for forming the packaged IC may cause problems because of the loss of adhesion between lead pads and package encapsulation leading to delamination and damage to the IC package. Also, exposed lead pads on the IC packages may lead to mechanical damage during handling and assembly.

Thus, a need still remains for an IC package system providing low cost manufacturing, improved yield, improved reliability, and greater flexibility to offer more functionality and fewer footprints on the PCB. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: providing a base; depositing a photoresist on the base; patterning the photoresist with an opening; filling the opening with a metal; depositing a further metal on the metal to form a lead pad; removing the photoresist; attaching a die over the base; bonding wires between the die and the lead pad; encapsulating the die and the lead pad in an encapsulation formed into a lead pad lock adjacent the lead pad; and removing the base.

Certain embodiments of the invention have other aspects in addition to or in place of those mentioned above. The aspects will become apparent to those skilled in the art from a reading of the following detailed description when taken with reference to the accompanying drawings.

BRIEF DESCRIPTION OF THE DRAWINGS

FIG. 8 is a component in an initial starting step for manufacturing the various embodiments of the present invention;

FIG. 9 is the structure of FIG. 8 after deposition and patterning of a layer of photoresist with openings;

FIG. 10 is the structure of FIG. 9 after filling the openings;

FIG. 11 is the structure of FIG. 10 after formation of the lead pads;

FIG. 24 is the structure of FIG. 23 after wire bond;

FIG. 25 is the structure of FIG. 24 after formation of the package encapsulation;

FIG. 26 is the structure of FIG. 25 after removal of the leadframe-type base of FIG. 25;

FIG. 27 is the structure of FIG. 26 after singulation into the integrated circuit package systems of FIG. 7;

BEST MODE FOR CARRYING OUT THE INVENTION

Figure 1:
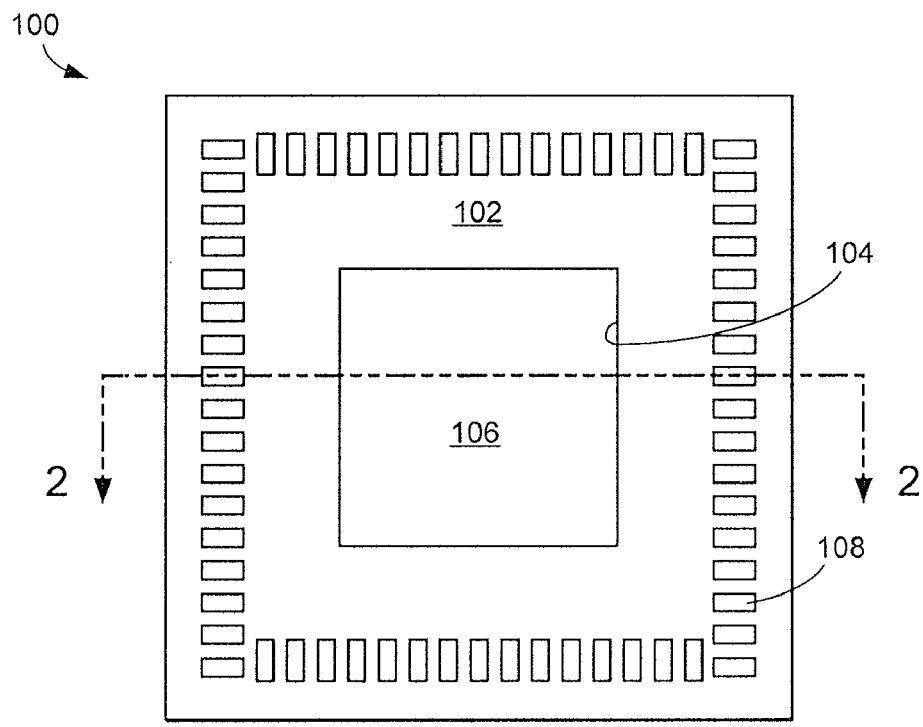
FIG. 1 is a bottom view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction at an angle to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, encapsulation, and/or removal of the material or as required in forming a described structure. The term "system" as used herein means and refers to the method and to the apparatus of the present invention in accordance with the context in which the term is used.

Referring now to FIG. 1, therein is shown a bottom view of an integrated circuit package system 100 in a first embodiment of the present invention. The integrated circuit package system 100 includes a package encapsulation 102, such as an epoxy molding compound (EMC), having a recess 104. The recess 104 contains a die attach adhesive 106. In and around the periphery of the package encapsulation 102 are a number of lead pads 108.

It will be understood that the lead pads 108 in various embodiments can be in a single row or in multiple rows on one, two, three, or four edges of the package encapsulation 102.

Figure 2:
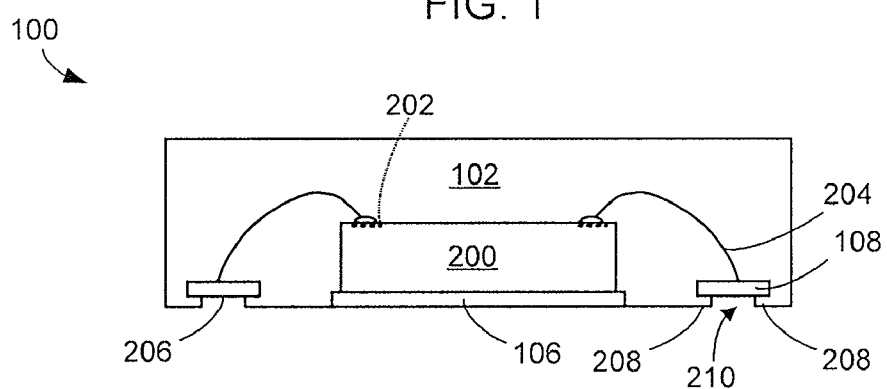
FIG. 2 is a cross-sectional view of the integrated circuit package system of FIG. 1 taken along line 2-2.

Referring now to FIG. 2, therein is shown a cross-sectional view of the integrated circuit package system 100 along line 2-2 of FIG. 1. The integrated circuit package system 100 includes a die 200 attached to the die attach adhesive 106. The die 200 has die pads 202 to which bond wires 204 are attached. The bond wires 204 are connected to the lead pads 108. The lead pads 108 have exposed areas 206 surrounded by lead pad locks 208 made up of the package encapsulation 102. It has been found that the lead pad locks 208 may have walls of any shape around the exposed areas 206 that are vertical to the exposed areas 206 to eliminate mold flash and encapsulate the die 200 and the bond wires 204. The lead pad locks 208 can surround a recess 210 in the package encapsulation 102 that is under the lead pad 108, exposing the exposed areas 206 of the lead pads 108. The recess 210 can have an opening width less than the horizontal dimension of the lead pads 108.

It has been discovered that the lead pad locks 208 enhance the locking mechanism around the lead pads 108 and improve the adhesion between the lead pads 108 and the package encapsulation 102. The lead pad locks 208 around the lead pads 108 further protect the lead pads 108 from any mechanical damage during assembly.

Figure 3:
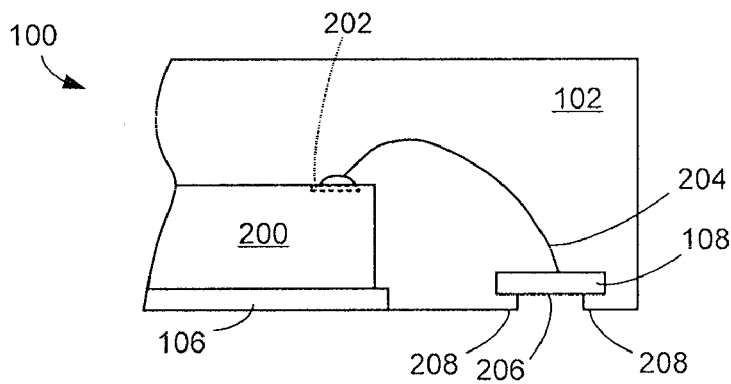
FIG. 3 is a close up view of a portion of the integrated circuit package system of FIG. 2.

Referring now to FIG. 3, therein is shown a close up of a portion of the integrated circuit package system 100 of FIG. 2. The integrated circuit package system 100 includes the die 200, the die pad 202, the bond wire 204, the lead pad 108 with the lead pad locks 208, the exposed area 206, and the package encapsulation 102.

Figure 4:
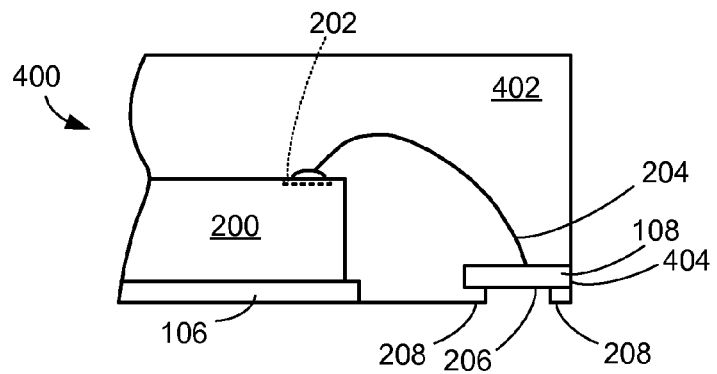
FIG. 4 is a view of a structure similar to FIG. 3 showing an integrated circuit package system in a second embodiment of the present invention.

Referring now to FIG. 4, therein is shown a view of a structure similar to FIG. 3 showing an integrated circuit package system 400 in a second embodiment of the present invention. The integrated circuit package system 400 includes the die pad 202, the bond wire 204, the lead pad 108 with the lead pad locks 208, and the exposed area 206. A package encapsulation 402 has been formed around the die 200 and singulated so as to leave a vertical side 404 of the lead pad 108 exposed to reduce the width of the integrated circuit package system 400.

Figure 5:
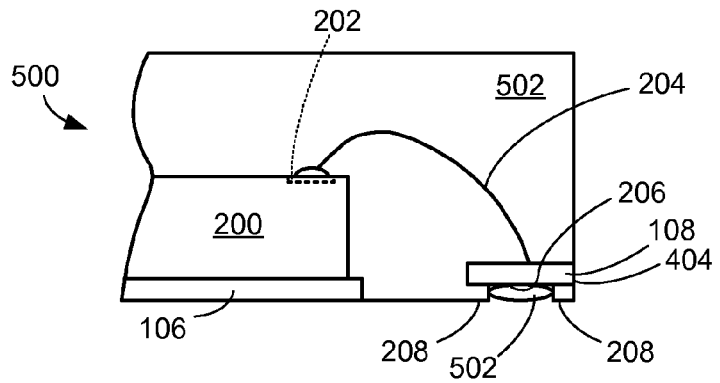
FIG. 5 is a view of a structure similar to FIG. 4 showing an integrated circuit package system in a third embodiment of the present invention.

Referring now to FIG. 5, therein is shown a view of a structure similar to FIG. 4 showing an integrated circuit package system 500 in a third embodiment of the present invention. The integrated circuit package system 500 includes the die 200, the die pad 202, the bond wire 204, the lead pad 108 with the lead pad locks 208, the exposed area 206, and the package encapsulation 102. In this embodiment, solder 502 has been placed on the exposed area 206 of the lead pad 108 for improved electrical conductivity.

Figure 6:
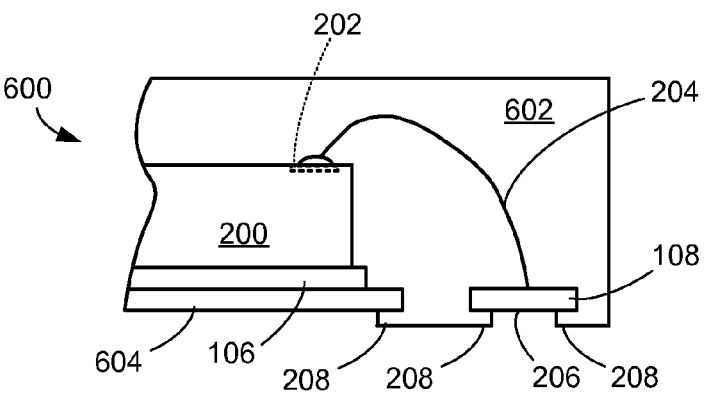
FIG. 6 is a view of a structure similar to FIG. 5 showing an integrated circuit package system in a fourth embodiment of the present invention.

Referring now to FIG. 6, therein is shown a view of a structure similar to FIG. 5 showing an integrated circuit package system 600 in a fourth embodiment of the present invention. The integrated circuit package system 600 includes the die 200, the die pad 202, the bond wire 204, the lead pad 108 with the lead pad locks 208, the exposed area 206, and a package encapsulation 602. In this embodiment, the die 200 is attached by the die attach adhesive 106 to an exposed die paddle 604. The exposed die paddle 604 is also held in place by the lead pad locks 208 formed by the package encapsulation 602. The exposed die paddle 604 would be visible in place of the die attach adhesive 106 if FIG. 1 showed this embodiment.

It has been discovered that the lead pad locks 208 improve the adhesion between the exposed die paddle 604 and the package encapsulation 602, and further protect the exposed die paddle 604 from mechanical damage.

Figure 7:
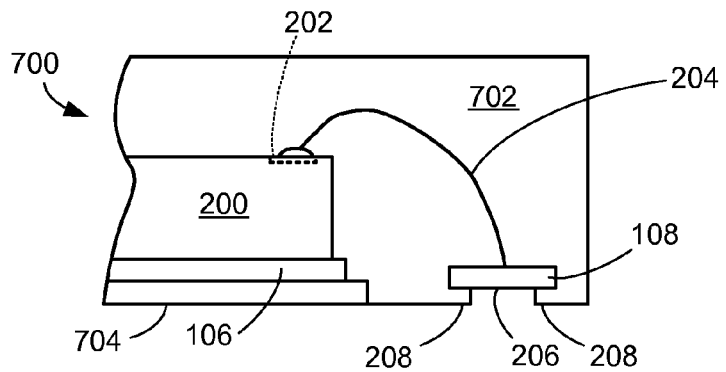
FIG. 7 is a view of a structure similar to FIG. 6 showing an integrated circuit package system in a fifth embodiment of the present invention.

Referring now to FIG. 7, therein is shown a view of a structure similar to FIG. 5 showing an integrated circuit package system 700 in a fifth embodiment of the present invention. The integrated circuit package system 700 includes the die 200, the die pad 202, the bond wire 204, the lead pad 108 with the lead pad locks 208, the exposed area 206, and a package encapsulation 702. In this embodiment, the die 200 is attached by the die attach adhesive 106 to an exposed die paddle 704. The exposed die paddle 704 would be visible in place of the die attach adhesive 106 if FIG. 1 showed this embodiment.

It has been discovered that the exposed die paddle 704 can be co-planar with the bottom of the package encapsulation 702 when the die attach paddle is formed directly on the leadframe-type base.

Referring now to FIG. 8, therein is shown a component in an initial starting step for manufacturing the various embodiments of the present invention. A leadframe-type base 800 is provided. The leadframe-type base 800 is similar to a conventional leadframe in being of a material such as copper (Cu) a Cu alloy, aluminum (Al), an Al alloy, or a polymer material.

Referring now to FIG. 9, therein is shown the structure of FIG. 8 after deposition and patterning of a layer of photoresist 900 with openings 902. It has been found that the openings 902 should have vertical walls with respect to the leadframe-type base 800 in order to avoid problems with encapsulant flash and to ensure proper locking by the lead pad locks 208 of FIG. 2. The openings 902 are not shown to scale because they may also be used for the formation of the lead pads 108 of FIG. 1 or the formation of the exposed die paddle 604 of FIG. 6. For convenience, only the openings 902 for the lead pads 108 are shown.

Referring now to FIG. 10, therein is shown the structure of FIG. 9 after filling the openings 902. The openings 902 are filled with a conductive metal 1000. The leadframe-type base 800 is similar to a conventional leadframe in being of a material such as copper (Cu) a Cu alloy, aluminum (Al), an Al alloy, or a polymer material.

Referring now to FIG. 11, therein is shown the structure of FIG. 10 after formation of the lead pads 108. The lead pads 108 of FIG. 1 are generally deposited by a deposition process, such as plating, sputtering, physical vapor deposition, chemical vapor deposition, etc., of a further metal 1100 on the conductive metal 1000. It has been discovered that a selective deposition of the further metal 1100 should be different metals, such as gold (Au), or alternatively, palladium ("Pd"), nickel ("Ni"), silver ("Ag"), Tin ("Sn"), their alloys or any combinations of these materials to optimize the contact for the bond wires 204 on one side and other electrical interconnects on the other side. The electrical interconnects can be bond wires, solder balls, or solder bumps.

Figure 12:
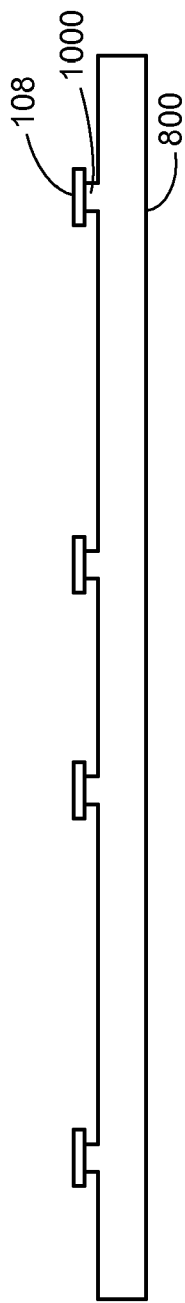
FIG. 12 is the structure of FIG. 11 after stripping/etching of the layer of photoresist.

Referring now to FIG. 12, therein is shown the structure of FIG. 11 after stripping/etching of the layer of photoresist 900 of FIG. 11. This process step will leave the lead pads 108 on and overhanging the conductive metal 1000.

Figure 13:
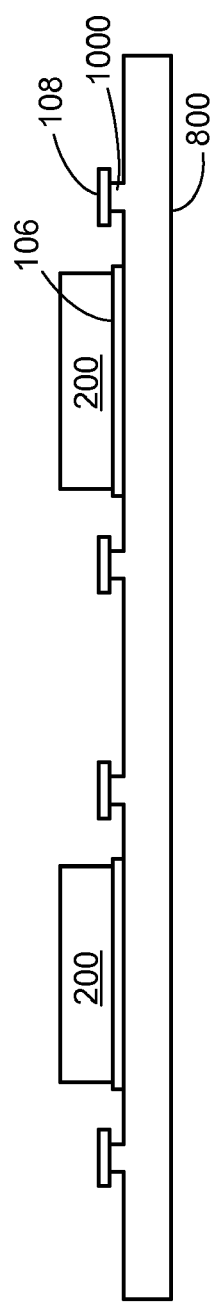
FIG. 13 is the structure of FIG. 12 after die attach.

Referring now to FIG. 13, therein is shown the structure of FIG. 12 after die attach. The dies 200 are attached, using the die attach adhesive 106, to the leadframe-type base 800. Where the embodiment with the exposed die paddle 604 of FIG. 6 is desired, the exposed die paddle 604 would have been formed the same way as the lead pads 108 on a portion of the conductive metal 1000. Then, the die 200 would be attached using the die attach adhesive 106 to the exposed die paddle 604 on the conductive metal 1000.

Figure 14:
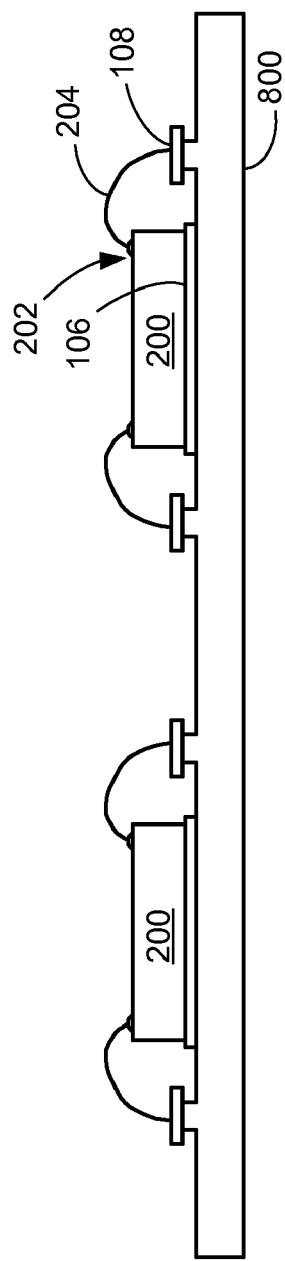
FIG. 14 is the structure of FIG. 13 after wire bond.

Referring now to FIG. 14, therein is shown the structure of FIG. 13 after wire bond. The bond wires 204 are wire bonded between the die pads 202 and the lead pads 108.

Figure 15:
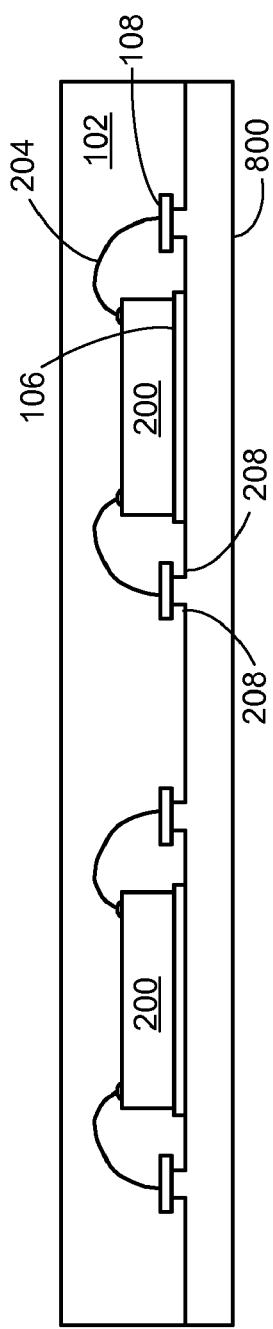
FIG. 15 is the structure of FIG. 14 after formation of the package encapsulation.

Referring now to FIG. 15, therein is shown the structure of FIG. 14 after formation of the package encapsulation 102. The lead pad locks 208 are formed at this time around the lead pads 108.

Figure 16:
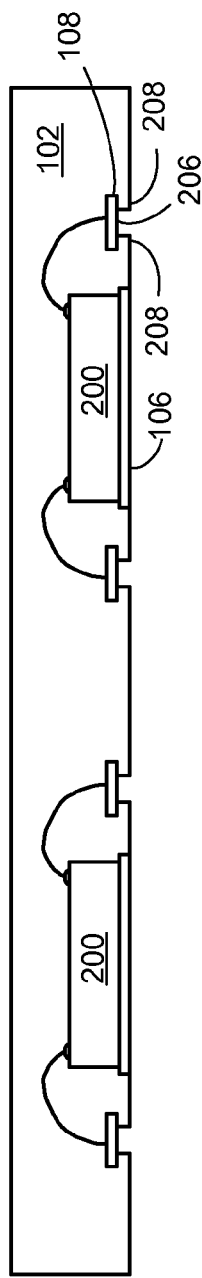
FIG. 16 is the structure of FIG. 15 after removal of the leadframe-type base of FIG. 15.

Referring now to FIG. 16, therein is shown the structure of FIG. 15 after removal of the leadframe-type base 800 of FIG. 15. After removal of the leadframe-type base 800 by etching, the lead pads 108 are left with the lead pad locks 208 of the package encapsulation 102 holding the lead pads 108 in place. In embodiments where the exposed die paddles 604 of FIG. 6 are provided, these will also be held in place by the lead pad locks 208.

Figure 17:
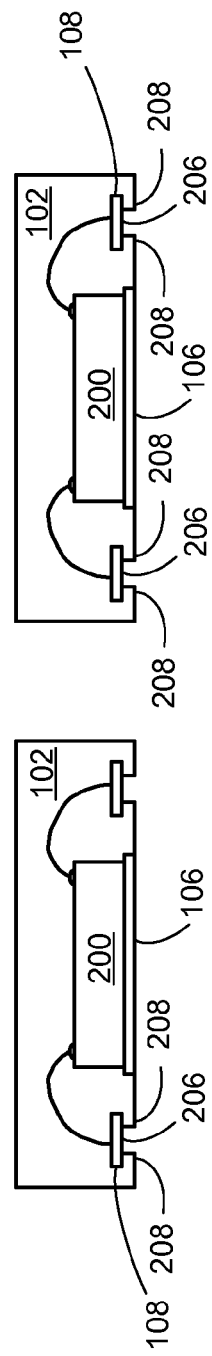
FIG. 17 is the structure of FIG. 16 after singulation into the integrated circuit package systems of FIG. 1.

Referring now to FIG. 17, therein is shown the structure of FIG. 16 after singulation into the integrated circuit packages systems 100. Each of the integrated circuit packages systems 100 have lead pad locks 208 around the exposed areas 206 of the lead pads 108. The die attach adhesive 106 is coplanar with the bottom of the package encapsulations 102.

Figure 18:
FIG. 18 is a component in an initial starting step for manufacturing the various embodiments of the present invention.

Referring now to FIG. 18, therein is shown a component in an initial starting step for manufacturing the various embodiments of the present invention. A leadframe-type base 1800 is provided. The leadframe-type base 1800 is similar to a conventional leadframe in being of a material such as copper (Cu) a Cu alloy, aluminum (Al), an Al alloy, or a polymer material.

Figure 19:
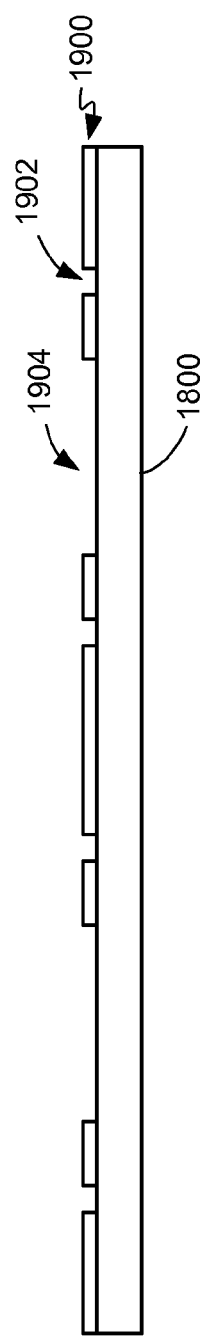
FIG. 19 is the structure of FIG. 18 after deposition and patterning of a layer of photoresist with openings.

Referring now to FIG. 19, therein is shown the structure of FIG. 18 after deposition and patterning of a layer of photoresist 1900 with openings 1902 and 1904. It has been found that the openings 1902 and 1904 should have vertical walls with respect to the leadframe-type base 1800 in order to avoid problems with encapsulant flash and to ensure proper locking by the lead pad locks 208 of FIG. 2.

Figure 20:
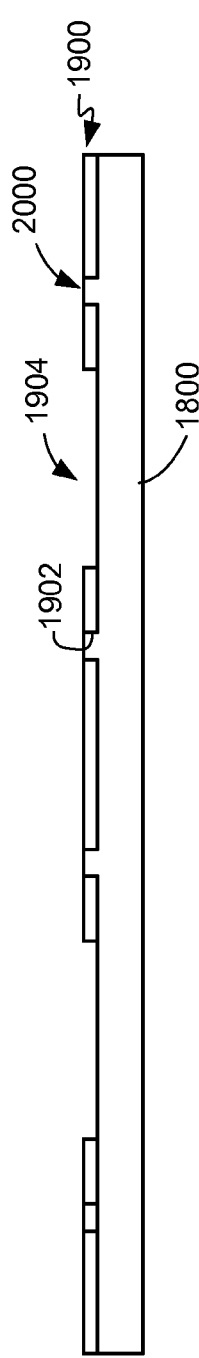
FIG. 20 is the structure of FIG. 19 after filling the openings.

Referring now to FIG. 20, therein is shown the structure of FIG. 19 after filling the openings 1902. The openings 1902 are filled with a conductive metal 2000 by selective deposition. The leadframe-type base 1800 is similar to a conventional leadframe in being of a material such as copper (Cu) a Cu alloy, aluminum (Al), an Al alloy, or a polymer material. Openings 1904 are left unfilled.

Figure 21:
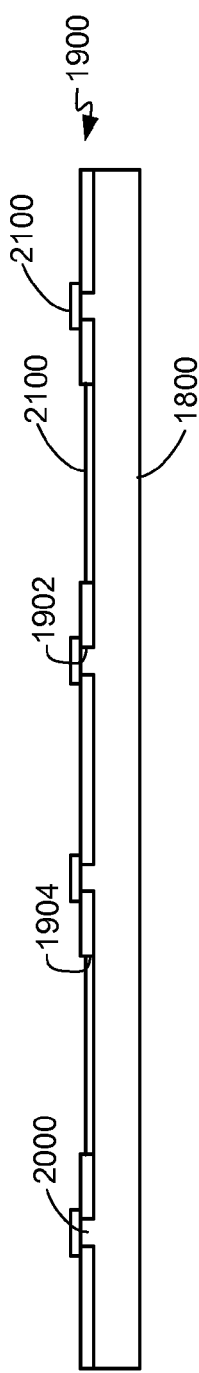
FIG. 21 is the structure of FIG. 20 during formation of the lead pads and exposed die paddles of FIG. 7.

Referring now to FIG. 21, therein is shown the structure of FIG. 20 during formation of the lead pads 108 and the exposed die paddles 704 of FIG. 7. The lead pads 108 and the exposed die paddles 704 are generally deposited by selectively depositing a further metal 2100 on the conductive metal 2000 and the leadframe-type base 1800. It has been discovered that a selective depositing of the further metal 2100 should be different metals, such as gold (Au), or alternatively, palladium ("Pd"), nickel ("Ni"), silver ("Ag"), Tin ("Sn"), their alloys or any combinations of these materials to optimize the contact for the bond wires 204 on one side and other electrical interconnects on the other side. The electrical interconnects can be bond wires, solder balls, or solder bumps.

Figure 22:
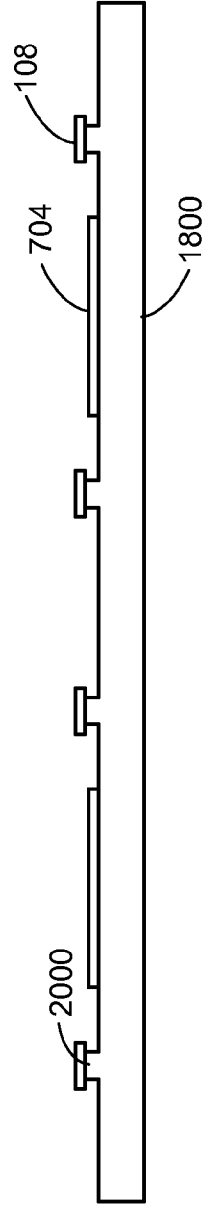
FIG. 22 is the structure of FIG. 21 after stripping/etching of the layer of photoresist.

Referring now to FIG. 22, therein is shown the structure of FIG. 21 after stripping/etching of the layer of photoresist 1900 of FIG. 21. This process step will leave the lead pads 108 on and overhanging the conductive metal 2000. The exposed die paddles 704 will be on the leadframe-type base 1800.

Figure 23:
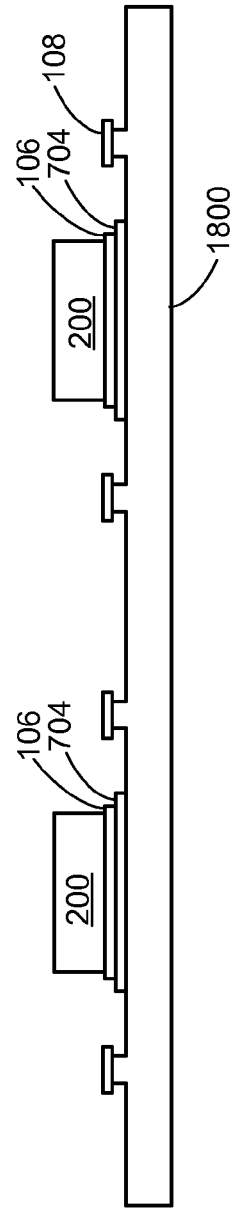
FIG. 23 is the structure of FIG. 22 after die attach.

Referring now to FIG. 23, therein is shown the structure of FIG. 22 after die attach. The dies 200 are attached, using the die attach adhesive 106, to the exposed die paddles 704.

Referring now to FIG. 24, therein is shown the structure of FIG. 23 after wire bond. The bond wires 204 are wire bonded between the die pads 202 and the lead pads 108.

Referring now to FIG. 25, therein is shown the structure of FIG. 24 after formation of the package encapsulation 702. The lead pad locks 208 are formed at this time.

Referring now to FIG. 26, therein is shown the structure of FIG. 25 after removal of the leadframe-type base 1800 of FIG. 25. After removal of the leadframe-type base 1800 by etching, the lead pads 108 are left with the lead pad locks 208 of the package encapsulation 702 holding the lead pads 108 in place.

Referring now to FIG. 27, therein is shown the structure of FIG. 26 after singulation into the integrated circuit packages systems 700. Each of the integrated circuit packages systems 700 have lead pad locks 208 around the exposed areas 206 of the lead pads 108. The exposed die paddles 704 are coplanar with the bottoms of the package encapsulations 702.

Figure 28:
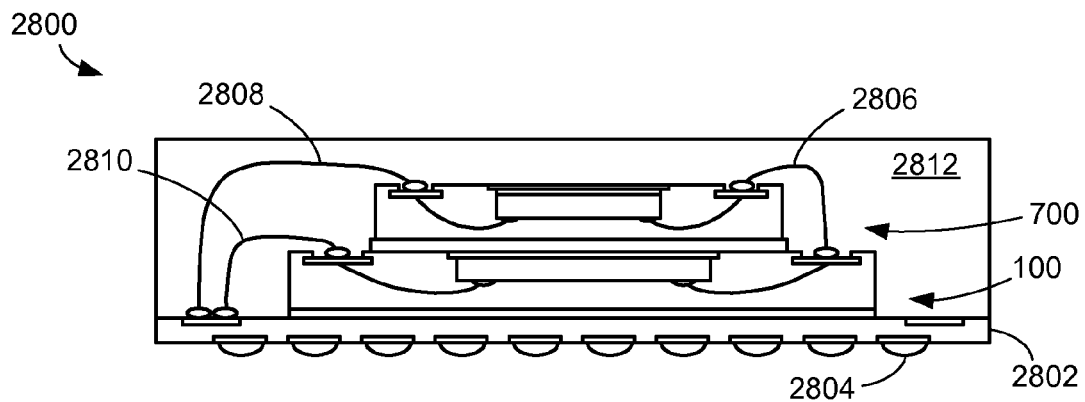
FIG. 28 is a package-in-package stacked package system.

Referring now to FIG. 28, therein is shown a package-in-package (PiP) stacked package system 2800. The PiP stacked package system 2800 incorporates, as examples, the integrated circuit package system 100 and the integrated circuit package system 700.

A package substrate 2802, having solder bumps 2804, has the integrated circuit package system 100 attached thereto in an active side down integrated circuit chip arrangement. The integrated circuit package system 100 has attached thereto the integrated circuit package system 700 also in an active side down integrated circuit chip arrangement.

The integrated circuit package system 700 is connected to the integrated circuit package system 100 by bond wires 2806. The integrated circuit package system 700 and the integrated circuit package system 100 are respectively connected to the package substrate 2802 by bond wires 2808 and 2810. The integrated circuit package system 100 and the integrated circuit package system 700, the bond wires 2806, 2808, and 2810 are encapsulated in a package encapsulation 2812.

Figure 29:
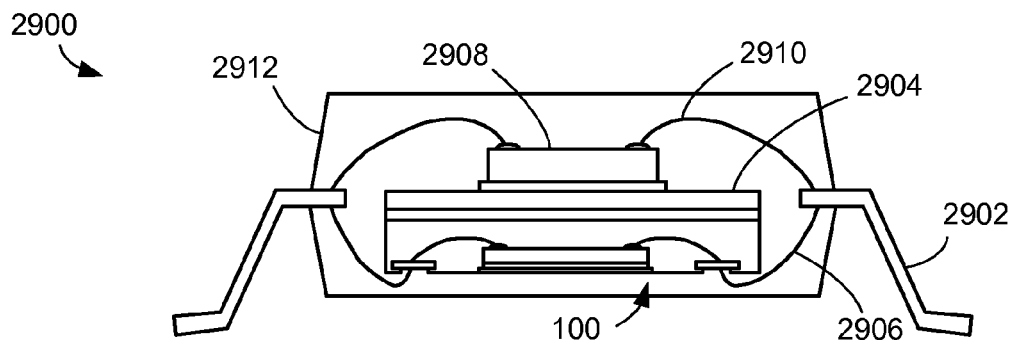
FIG. 29 is a leaded package-in-package system.

Referring now to FIG. 29, therein is shown a leaded PiP system 2900. The leaded package-in-package system 2900 includes external leads 2902 and a die attach paddle 2904. On the under side of the die attach paddle 2904 is attached, for example, the integrated circuit package system 100 in an active side up integrated circuit chip arrangement.

Bond wires 2906 connect the integrated circuit package system 100 to the lead fingers 2902. Attached on the top of the die attach paddle 2904 is a die 2908 connected by bond wires 2910 to the external leads 2902. The integrated circuit package system 100, the bond wires 2906 and 2910, the die 2908, and the die attach paddle 2904 are encapsulated in a further package encapsulation 2912 along with a portion of the external leads 2902.

Figure 30:
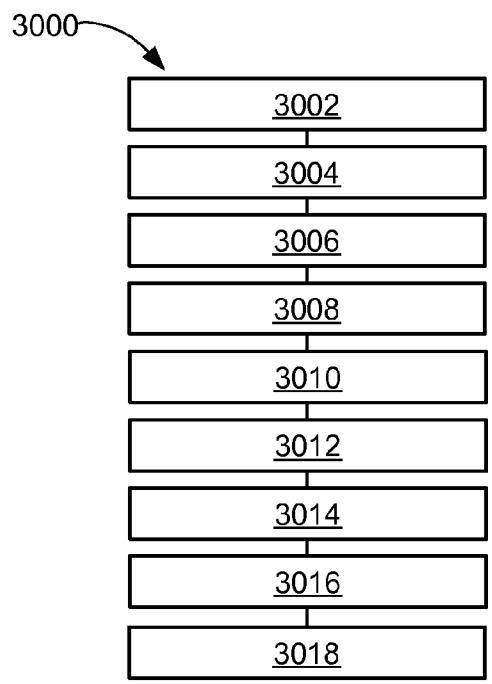
FIG. 30 is a flow chart for an integrated circuit package system for manufacturing the integrated circuit package systems of FIGS. 3, 4, 5, 6, and 7.

Referring now to FIG. 30, therein is shown a flow chart for an integrated circuit package system 3000 for manufacturing the integrated circuit package systems 100, 400, 500, 600, and 700. The integrated circuit package system 3000 includes: providing a base in a block 3002; depositing a photoresist on the base in a block 3004; patterning the photoresist with an opening in a block 3006; filling the opening with metal in a block 3008; depositing a further metal on the metal to form a lead pad in a block 3010; removing the photoresist in a block 3012; attaching a die to the base in a block 3014; encapsulating the die and the lead pad in an encapsulation formed into a lead pad lock adjacent the lead pad in a block 3016; and etching away the base in a block 3018.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit package system comprising:
   providing a base;
   depositing a photoresist on the base;
   patterning the photoresist with an opening;
   filling the opening with a metal;
   depositing a further metal on the metal to form a lead pad with the lead pad entirely planar;
   removing the photoresist;
   attaching a die over the base;
   bonding wires between the die and the lead pad;
   encapsulating the die and the lead pad in an encapsulation, having a recess, formed into a lead pad lock adjacent the lead pad and the recess adjacent to the lead pad lock and under the lead pad, with the recess exposing the lead pad and having the opening width less than a horizontal dimension of the lead pad; and
   removing the base.

2. The method as claimed in claim 1 wherein:
   patterning the photoresist includes patterning the photoresist with another opening; and
   depositing the further metal on the base in the another opening to form a die attach paddle.

3. The method as claimed in claim 1 wherein:
   patterning the photoresist includes patterning the photoresist with another opening;
   filling the another opening with the metal; and
   depositing the further metal on the metal in the another opening to form a die attach paddle.

4. The method as claimed in claim 1 further comprising singulating the encapsulation to expose a vertical side of the lead pad.

5. The method as claimed in claim 1 further comprising:
   attaching the encapsulation to a lead finger or a package substrate; and
   encapsulating the encapsulation and a portion of the lead finger or package substrate with another encapsulation.

6. A method of manufacturing an integrated circuit package system comprising:
   providing a leadframe-type base;
   depositing a photoresist on the leadframe-type base;
   patterning the photoresist with a vertical opening;
   depositing a metal on the leadframe-type base through vertical opening;
   depositing a further metal on the metal to form a lead pad the metal in the vertical opening to form a lead pad with the lead pad entirely planar;
   removing the photoresist;
   attaching a die over the leadframe-type base;
   wirebonding bond wires between the die and the lead pad;

encapsulating the die and the lead pad in an encapsulation, having a recess, formed into a lead pad lock adjacent the lead pad and the recess adjacent to the lead pad lock and under the lead pad, with the recess exposing the lead pad and the recess having the opening width less than a horizontal dimension of the lead pad;

etching away the leadframe-type base and the metal; and singulating the die and the encapsulation.

7. The method as claimed in claim 6 wherein:

patterning the photoresist includes patterning the photoresist with another opening;

depositing the further metal in the another opening to form a die attach paddle; and attaching the die to the die attach paddle.

8. The method as claimed in claim 6 wherein:

patterning the photoresist includes patterning the photoresist with another opening;

depositing a metal on the leadframe-type base through the another opening;

depositing the further metal on the metal in the another opening to form a die attach paddle; and attaching the die to the die attach paddle.

9. The method as claimed in claim 6 wherein:

singulating the die exposes a side of the lead pad and soldering the lead pad adjacent the lead pad lock.

10. The method as claimed in claim 6 further comprising:

attaching the encapsulation to a lead finger or a package substrate; and encapsulating the encapsulation and a portion of the lead finger or package substrate.

11. An integrated circuit package system comprising:

a die;

a lead pad adjacent the die with the lead pad entirely planar;

bond wires connecting the die and the lead pad; and an encapsulation having a recess, the encapsulation for encapsulating the die and the lead pad with the encapsulation formed into a lead pad lock adjacent the lead pad, the recess adjacent the lead pad lock and under the lead pad, with the recess exposing the lead pad and the recess having the opening width less than a horizontal dimension of the lead pad.

12. The system as claimed in claim 11 further comprising:

an exposed die paddle having the die attached thereto and coplanar with the bottom of the encapsulant.

13. The system as claimed in claim 11 further comprising:

an exposed die paddle having the die attached thereto and the encapsulant forming the lead pad lock adjacent thereto.

14. The system as claimed in claim 11 wherein:

the lead pad has a vertical side thereof exposed through the encapsulation.

15. The system as claimed in claim 11 further comprising:

a lead finger or a package substrate; and a further encapsulation encapsulating the encapsulation and a portion of the lead finger or package substrate.

16. The system as claimed in claim 11 wherein:

the lead pad is made of a plurality of different metals; and the lead pad lock has a vertical wall.

17. The system as claimed in claim 16 further comprising:

an exposed die paddle having the die attached thereto, coplanar with the bottom of the encapsulant, and made of a plurality of different metals.

18. The system as claimed in claim 16 further comprising:

an exposed die paddle made of a plurality of different metals, having the die attached thereto, and the encapsulant forming the lead pad lock adjacent thereto.

19. The system as claimed in claim 16 further comprising:

solder is on the lead pad adjacent the lead pad lock.

20. The system as claimed in claim 16 further comprising:

a lead finger or a package substrate;

a bond wire connecting the lead pad to the lead finger or package substrate; and a further encapsulation encapsulating the encapsulation, the bond wire, and a portion of the lead finger or package substrate.

\* \* \* \* \*